(12) United States Patent
Cooney, III et al.

(10) Patent No.: US 6,674,168 B1
(45) Date of Patent: Jan. 6, 2004

(54) SINGLE AND MULTILEVEL REWORK

(75) Inventors: Edward C. Cooney, III, Jericho, VT (US); Robert M Geffken, Burlington, VT (US); Vincent J McGahay, Poughkeepsie, NY (US); William T. Motsiff, Essex Junction, VT (US); Mark P. Murray, Burlington, VT (US); Amanda L. Piper, Wappingers Falls, NY (US); Anthony K. Stamper, Williston, VT (US); David C. Thomas, Richmond, VT (US); Christy S. Tyberg, Croton-On-Hudson, NY (US); Elizabeth T. Webster, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/248,452

(22) Filed: Jan. 21, 2003

(51) Int. Cl.[7] .................. H01L 21/00; H01L 23/48; H01L 23/52
(52) U.S. Cl. ............... 257/758; 257/752; 257/759; 257/760; 257/762; 438/4
(58) Field of Search .................. 438/687, 4, 622–624; 257/621, 622, 752, 758, 759, 760, 762

(56) References Cited

U.S. PATENT DOCUMENTS

| 5,480,812 | A | * | 1/1996 | Salisbury |
| 6,218,302 | B1 | * | 4/2001 | Braeckelmann |
| 6,332,988 | B1 | | 12/2001 | Berger, Jr. et al. |

* cited by examiner

Primary Examiner—Ha Tran Nguyen
(74) Attorney, Agent, or Firm—McGinn & Gibb, PLLC; William D. Sabo, Esq.

(57) ABSTRACT

A method of reworking BEOL (back end of a processing line) metallization levels of damascene metallurgy comprises forming a plurality of BEOL metallization levels over a substrate, forming line and via portions in the BEOL metallization levels, selectively removing at least one of the BEOL metallization levels to expose the line and via portions, and replacing the removed BEOL metallization levels with at least one new BEOL metallization level, wherein the BEOL metallization levels comprise a first dielectric layer and a second dielectric layer, and wherein the first dielectric layer comprising a lower dielectric constant material than the second dielectric layer.

20 Claims, 13 Drawing Sheets

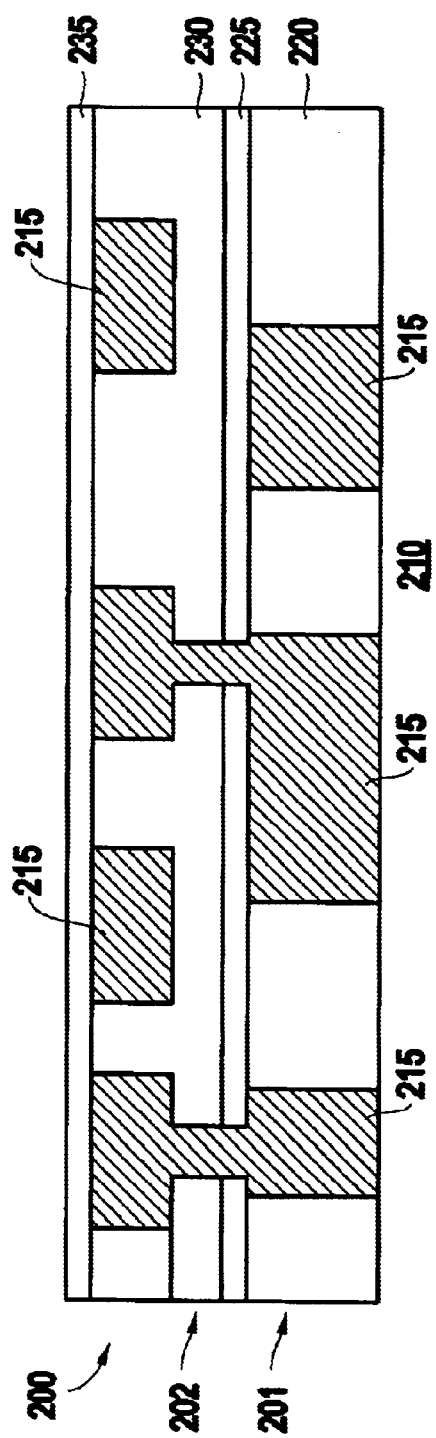
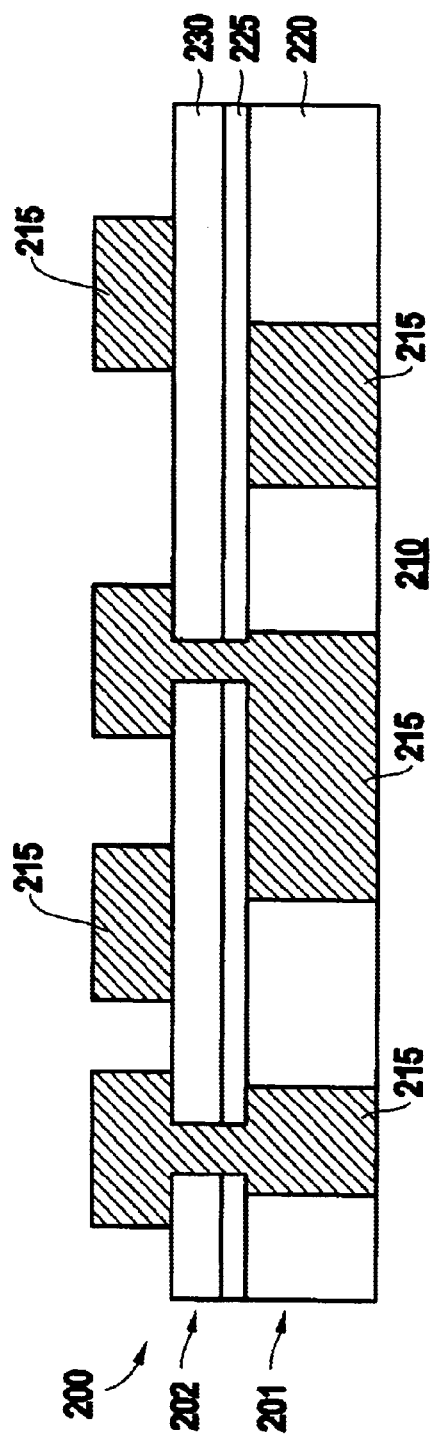
FIG.6
FIG.7

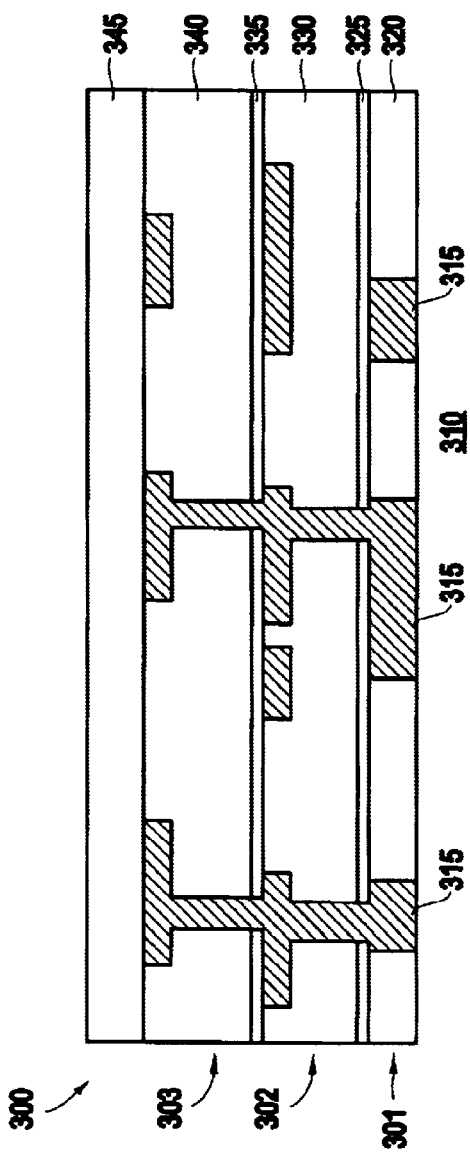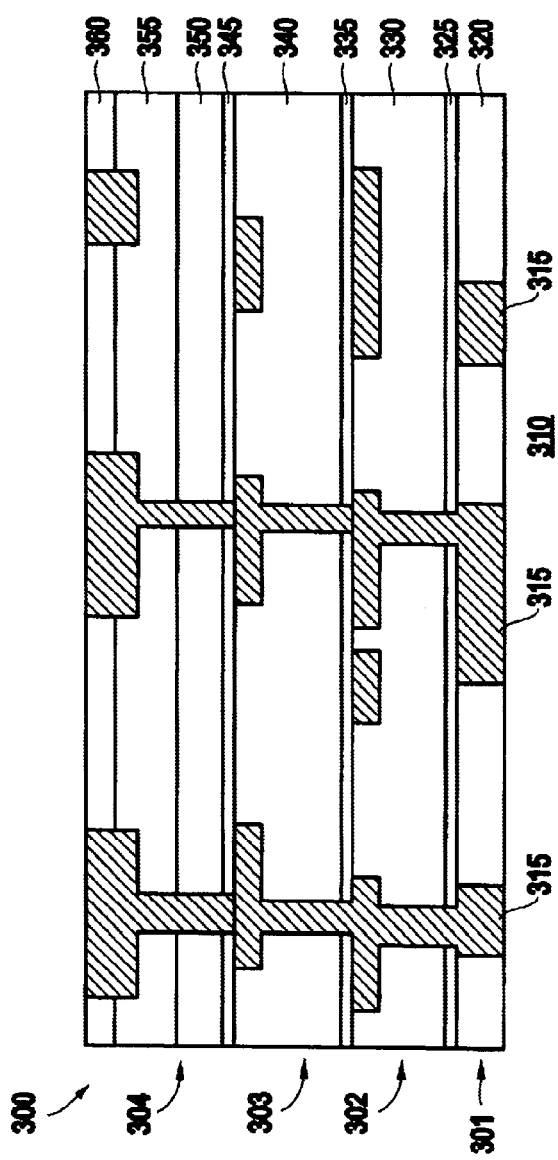

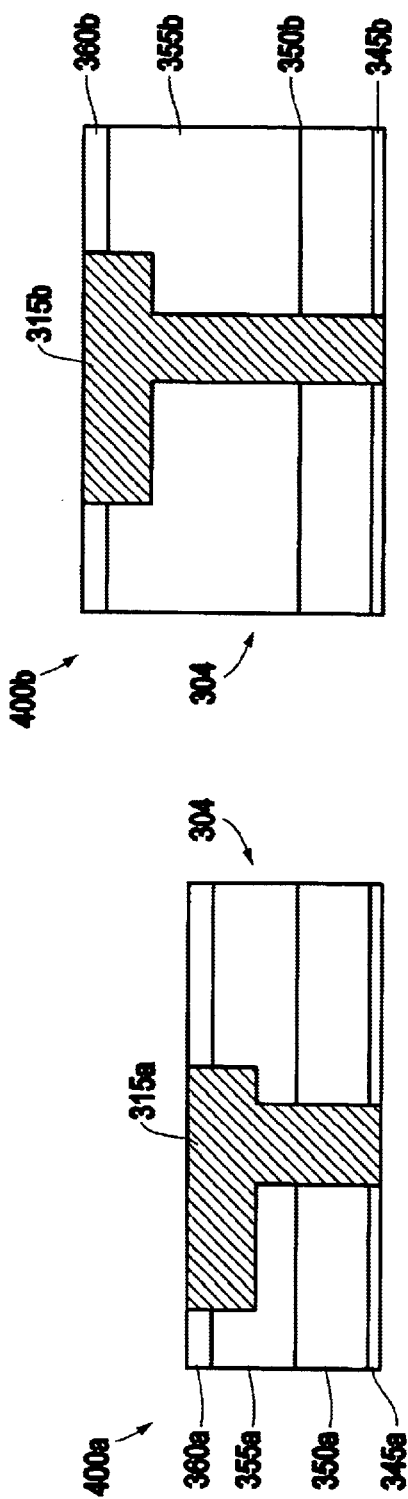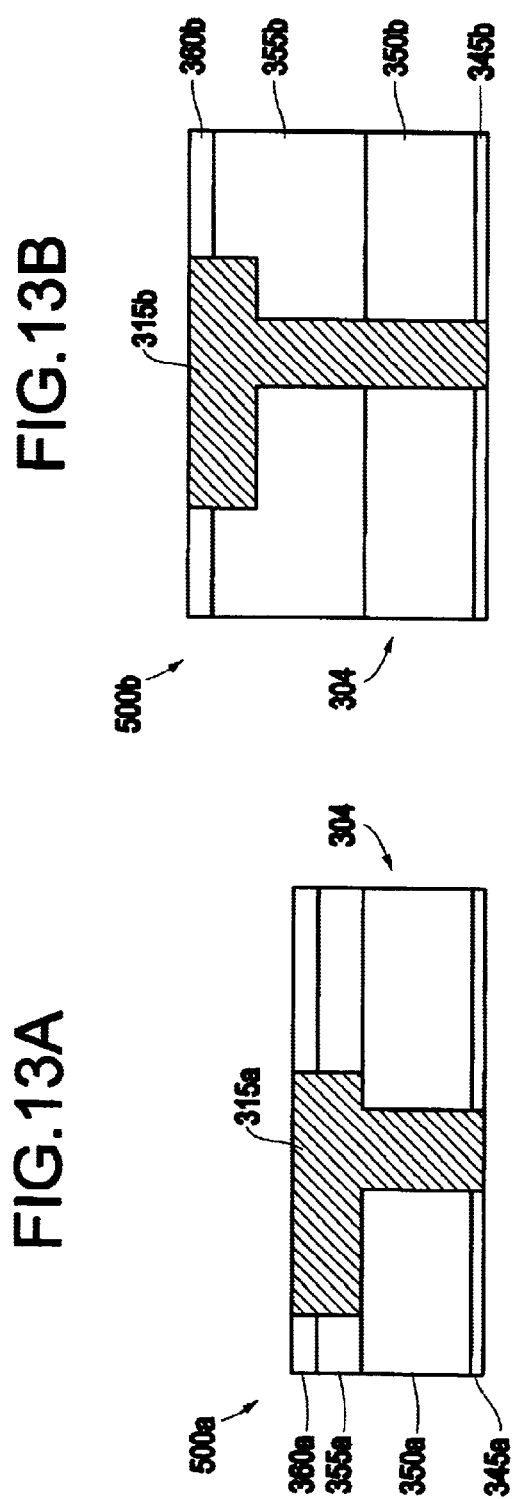

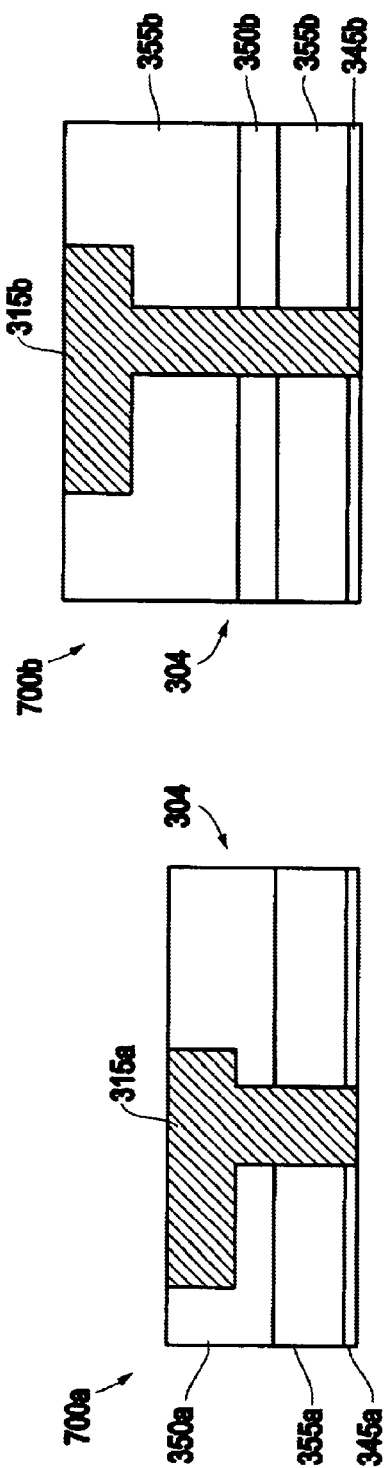
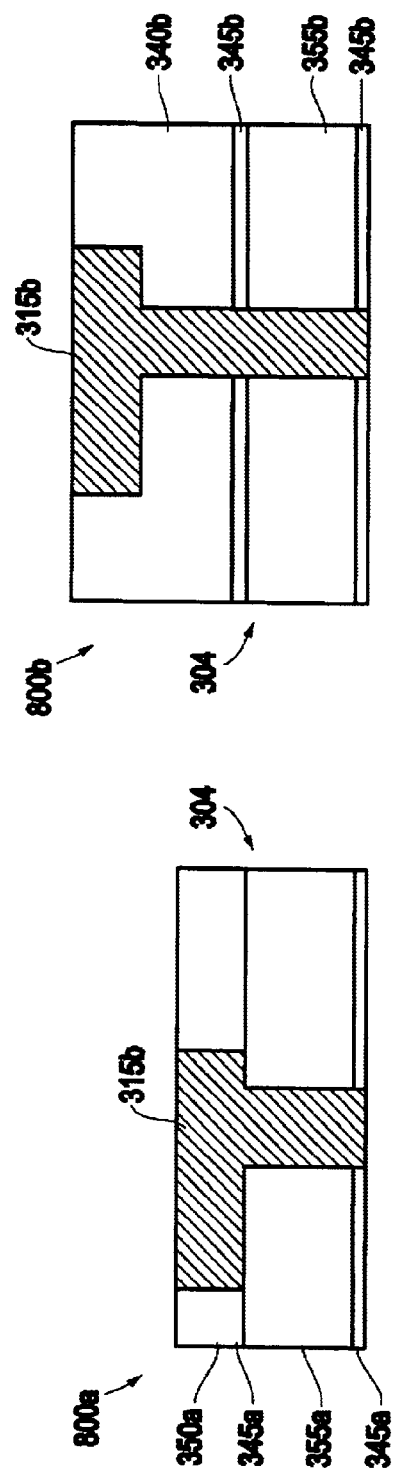

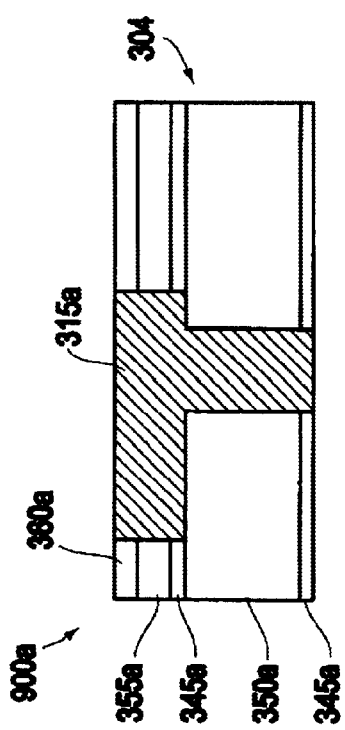
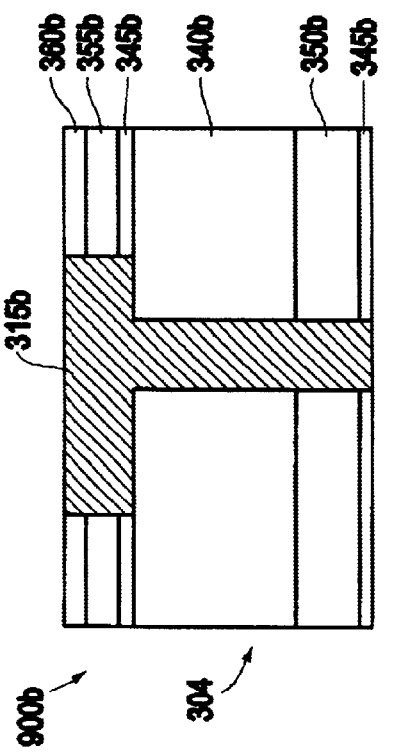
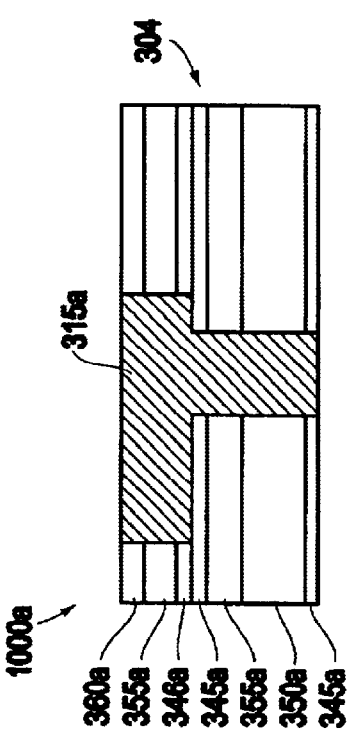
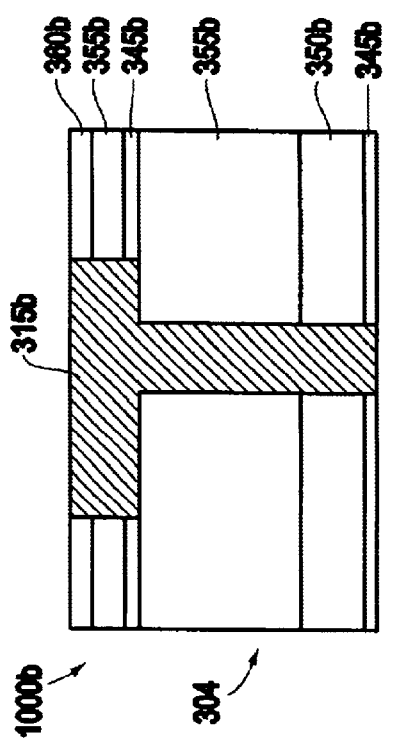

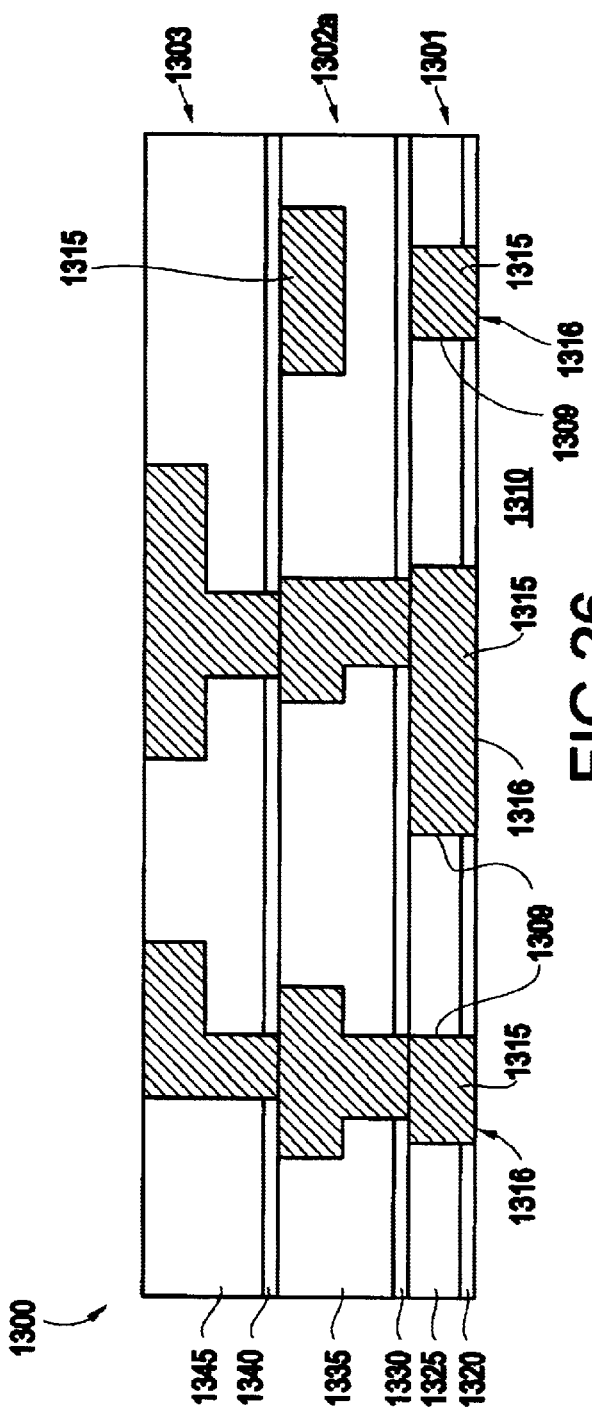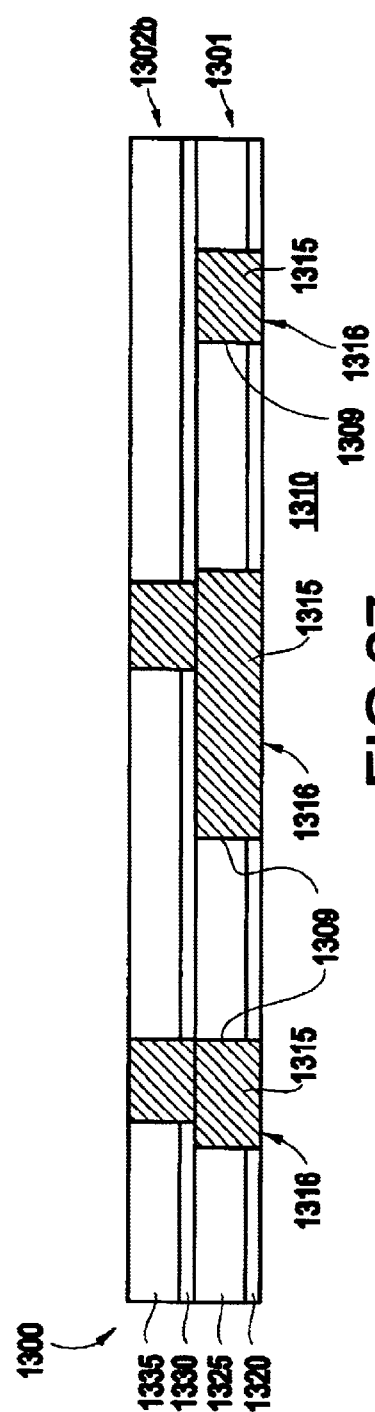

SINGLE AND MULTILEVEL REWORK

BACKGROUND OF THE INVENTION

1. Technical Field

The present invention generally relates to integrated circuit processing, and more particularly to methods relating to integrated circuit rework processes on semiconductor wafers 2. Related Art Currently, integrated circuit BEOL (back end of the semiconductor processing rework processes are used for both ASIC (Application Specific Integrated Circuit) design and normal production. These rework processes have been developed for both and copper multi-level-metal wiring and are generally employed to correct yield or problems or a photomask error. Such rework processes enable QTAT (quicker turn time) design verification and save integrated circuit fabrication costs. An example of a process is given in U.S. Pat. No. 6,332,988, the complete disclosure of which is incorporated by reference, wherein a process for reworking electroplated solder bump is disclosed.

The introduction of copper and low dielectric (k) technologies presents the for additional rework process definition because the physical and chemical properties low k dielectric materials differ significantly from silicon dioxide, and therefore are not to the same rework procedures. Such rework processes must integrate with POR (process of record back-end-of-line) processing sequences, maintain planarity throughout rework process, remove multiple thin films including $Si_3N_4$, low k organic dielectrics, copper, liner materials, and stop on the top of the dielectric and tungsten interconnect region residing the electronically active devices such as transistors (typically called the front end). This dielectric is typically Boron-doped SiO2 or "BPSG"(Boron Phosphorous Silicate Glass). The BPSG, an electrical conductor fabricated of tungsten damascene is typically utilized so this can be abbreviated "BPSG/W." Some conventional processes teach methods for a defective SiLK® layer caused by improper coating such as for a photoresist process. However, these conventional processes do not address rework of the final metal in addition to the dielectric BEOL.

Additionally, as integrated circuit device dimensions shrink with each successive the pitch at the lower wiring levels becomes challenging with respect to overlay shorting, via resistance of copper to copper vias in low k materials, line to metal line capacitance, and metal level to metal level cooling issues.

Therefore, there is a need for an integrated circuit rework process which results in vertical space between any or all BEOL levels, and which would be instrumental infacilitating removal and reconstruction of defective BEOL levels and in securing desired process latitude with respect to overlay, via resistance, line capacitance, and cooling.

SUMMARY OF INVENTION

The present invention has been devised, and it is an object of the present invention to provide a method for both a single chip wiring or interconnect metal level as well as multilevel rework processing.

There is provided, according to one aspect of the invention, a method of reworking BEOL (back end of a processing line) interconnect levels of damascene metallurgy, wherein each of the levels comprise a line portion and a via portion embedded in multiple dielectric layers. The method comprises sequentially removing the interconnect levels by selectively removing the multiple dielectric layers beginning with an uppermost dielectric layer. Then, the line and via portions of the interconnect levels are exposed. Next, the exposed line and via portions of the interconnect levels are coplanarized. Finally, the removed interconnect levels are replaced with full interconnect levels of damascene metallurgy.

Furthermore, the multiple dielectric layers are formed by stacking a first dielectric layer over a second dielectric layer, wherein the first dielectric layer comprises a lower dielectric constant material than the second dielectric layer. Also, the multiple dielectric layers are from the uppermost dielectric layer to a scratch stop layer, wherein the scratch stop layer is positioned below a lowest one of the BEOL interconnect levels. Moreover, the line and via portions form wiring conductors, wherein the wiring conductors comprise copper. Additionally, the line and via portions are removed at a faster rate than the multiple dielectric layers.

The method further comprises depositing a polish stop layer over the exposed line and via portions, wherein the polish stop layer enables removal of the line and via portions to a thickness coplanar with a lowermost dielectric layer. Furthermore, the multiple dielectric layers are formed to include a first dielectric layer and a second dielectric layer, wherein the first dielectric layer and the second dielectric layer have different removal properties. Also, the via portion of the first interconnect level connects to the via portion of the second interconnect level, wherein the via portion of the first interconnect level is formed smaller than the via portion of the second interconnect level. Additionally, the method further comprises depositing a cap hardmask layer over the exposed line and via portions, wherein the cap hardmask layer comprises one of nitrides, oxides, $Si_3N_4$, TaN, Ta or W.

Alternatively, the method of reworking BEOL (back end of a processing line) metallization levels of damascene metallurgy comprises forming a plurality of BEOL metallization levels over a substrate, forming line and via portions in the BEOL metallization levels, selectively removing at least one of the BEOL metallization levels to expose the line and via portions, and replacing the removed BEOL metallization levels with at least one new BEOL metallization level, wherein the BEOL metallization levels comprise a first dielectric layer and a second dielectric layer, wherein the first dielectric layer comprises a lower dielectric constant material than the second dielectric layer.

The invention provides an integrated circuit structure that includes a first section comprising logical and functional devices and interconnection layers above the first section. Each of the interconnection layers comprises a first insulator layer, a second insulator layer above the first insulator layer and electrical wiring within the first insulator layer and the second insulator layer. The first insulator layer has a lower dielectric constant than that of the second insulator layer and the second insulator layer is harder than the first insulator layer.

The second layer comprises a protection layer that protects the first layer during rework operations performed on overlying layers of interconnections. The first insulator layer comprises an organic insulator. The second insulator layer comprises one of nitrides, oxides, $Si_3N_4$, TaN, Ta,W. The electrical wiring comprises damascene copper. Each grouping of the first insulator layer, the second insulator layer, and the electrical wiring comprise a single interconnection layer within the structure.

The invention further provides a method of reworking such interconnection layers above logical and functional layers of an integrated circuit structure. The method removes the upper insulator of a first interconnection layer and then removing the electrical wiring and the lower insulator of the first interconnection layer in a selective removal process that does not affect an upper insulator of a second interconnect layer positioned immediately below the first interconnect layer. The upper insulator protects a lower insulator of the second interconnect layer during the process of removing the electrical wiring and the lower insulator in the first interconnect. The process completely removes the first interconnection layer and leaves the interconnection layer in tact, and a replacement interconnect layer is formed in place of the first interconnect layer.

The process of removing the upper insulator also removes a portion of the lower insulator and exposes portions of the electrical wiring. After removing the upper insulator, the invention optionally depositing an etch stop layer on partially removed portions of the lower insulator and on exposed portions of the electrical wiring. After depositing the etch stop layer, the invention removes the metal wiring, thereby leaving the partially removed portions of the first lower insulator and portions of the etch stop layer. Subsequently the etch stop layer is removed. The etch stop layer protects the lower insulator during the process of removing the metal wiring.

The invention provides a structure that includes a protective hard insulator layer above an underlying softer low dielectric constant (low k) layer within each interconnect layer. This structure allows each interconnect layer in the BEOL processed layers to be removed individually. More specifically, in the first phase of the removal process, the overlying harder dielectric is removed first (along with a portion of the softer underlying low k dielectric). Then, the remainder of the low k dielectric and the metal wiring lines are removed in the second phase of the removal process. This second phase of the removal process does not affect the adjacent hard insulator of the next underlying interconnect layer that is just below the interconnect layer being removed. Thus, the invention is very selective and allows a single interconnect layer to be removed (even a low k dielectric layer) without affecting the next underlying layer (that it protected by its upper hard protective insulator layer). This substantially simplifies rework of the BEOL layers (by allowing single layers to be reworked).

BRIEF DESCRIPTION OF DRAWINGS

The invention will be better understood from the following detailed description of the preferred embodiments of the invention with reference to the drawings, in which:

FIG. 6 is a cross-sectional schematic diagram of a second embodiment of an integrated circuit structure undergoing rework processing according to the present invention;

FIG. 7 is a cross-sectional schematic diagram of a second embodiment of an integrated circuit structure undergoing rework processing according to the present invention;

FIG. 11 is a cross-sectional schematic diagram of a third embodiment of an integrated circuit structure undergoing rework processing according to the present invention;

FIG. 12 is a cross-sectional schematic diagram of a third embodiment of an integrated circuit structure undergoing rework processing according to the present invention;

FIG. 13(a) is a cross-sectional schematic diagram of a third embodiment of an integrated circuit structure undergoing rework processing according to the present invention;

FIG. 13(b) is a cross-sectional schematic diagram of a third embodiment of an integrated circuit structure undergoing rework processing according to the present invention;

FIG. 14(a) is a cross-sectional schematic diagram of a third embodiment of an integrated circuit structure undergoing rework processing according to the present invention;

FIG. 14(b) is a cross-sectional schematic diagram of a third embodiment of an integrated circuit structure undergoing rework processing according to the present invention;

FIG. 16(a) is a cross-sectional schematic diagram of a third embodiment of an integrated circuit structure undergoing rework processing according to the present invention;

FIG. 16(b) is a cross-sectional schematic diagram of a third embodiment of an integrated circuit structure undergoing rework processing according to the present invention;

FIG. 17(a) is a cross-sectional schematic diagram of a third embodiment of an integrated circuit structure undergoing rework processing according to the present invention;

FIG. 17(b) is a cross-sectional schematic diagram of a third embodiment of an integrated circuit structure undergoing rework processing according to the present invention;

FIG. 18(a) is a cross-sectional schematic diagram of a third embodiment of an integrated circuit structure undergoing rework processing according to the present invention;

FIG. 18(b) is a cross-sectional schematic diagram of a third embodiment of an integrated circuit structure undergoing rework processing according to the present invention;

FIG. 19(a) is a cross-sectional schematic diagram of a third embodiment of an integrated circuit structure undergoing rework processing according to the present invention;

FIG. 19(b) is a cross-sectional schematic diagram of a third embodiment of an integrated circuit structure undergoing rework processing according to the present invention;

FIG. 26 is a cross-sectional schematic diagram of a fifth embodiment of an integrated circuit structure undergoing rework processing according to the present invention;

FIG. 27 is a cross-sectional schematic diagram of a fifth embodiment of an integrated circuit structure undergoing rework processing according to the present invention;

DETAILED DESCRIPTION

Figure 1:
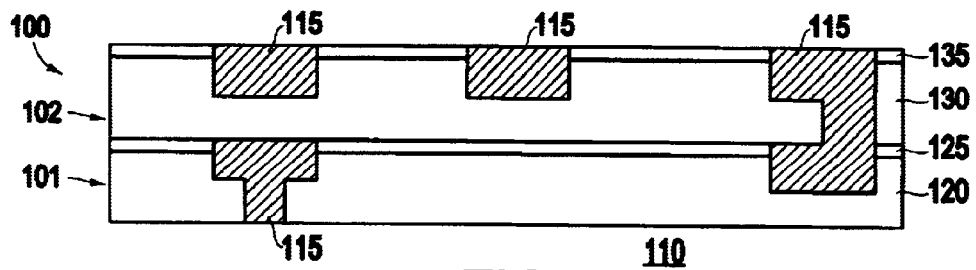
FIG. 1 is a cross-sectional schematic diagram of a first embodiment of an integrated circuit structure undergoing rework processing according to the present invention.

There is a need for an integrated circuit rework process which results in additional vertical space between any or all BEOL levels, and which would be instrumental in facilitating removal and reconstruction of defective BEOL levels and in securing desired process window latitude with respect to overlay, via resistance, line capacitance, and cooling.

Referring now to the drawings, and more particularly to FIGS. 1 through 30, there are shown preferred embodiments of the method and structures according to the present invention. Specifically, in FIGS. 1 through 5, a first embodiment of the present invention is illustrated. Traditionally, low k dielectrics have not been used for the interconnect layers (BEOL processed layers) that are formed over the logical/functional layers (BEOL processed section) of an integrated circuit chip. The invention provides a structure that includes a protective hard insulator layer above an underlying softer low dielectric constant (low k) layer within each interconnect layer. This structure allows each interconnect layer in the BEOL processed layers to be removed individually. More specifically, in the first phase of the removal process, the overlying harder dielectric is removed first (along with a portion of the softer underlying low k dielectric). Then, the remainder of the low k dielectric and the metal wiring lines are removed in the second phase of the removal process. This second phase of the removal process does not affect the adjacent hard insulator of the next underlying interconnect layer that is just below the interconnect layer being removed. Thus, the invention is very selective and allows a single interconnect layer to be removed (even a low k dielectric layer) without affecting the next underlying layer (that it protected by its upper hard protective insulator layer). This substantially simplifies rework of the BEOL layers (by allowing single layers to be reworked). According to the first embodiment of the present invention a novel multilevel rework process for a copper/low k BEOL fabrication is shown.

BEOL fabrication processes are designed to maintain planarity as each successive metal level is typically formed using damascene and dual damascene techniques. According to the present invention, the multilevel rework process generally maintains this planarity as the levels and films are simultaneously removed. A method which achieves this multilevel, multifilm removal is provided by the first embodiment of the present invention.

In FIG. 1 a multilevel integrated circuit structure 100 is shown formed on top of a BPSG/W substrate 110. Above the substrate 110 is a first insulator layer 120 comprising a low dielectric constant material (low k dielectric), such as Polymeric low K dielectrics commercial products such as SiLK®, available from Dow Chemical Company, NY, USA, FLARE®, available from Honeywell, NJ, USA, and traditional materials such as silicon dioxide, fluorinated silicon dioxide (FSG), and microporous glasses such as Nanoglass® (Porous $SiO_2$), available from Honeywell, Inc., NJ, USA, as well as Black Diamond (Carbon-doped $SiO_2$), available from Applied Material, CA, USA; Coral (Silicon cabide based dielectrics), available from Novellus Systems, Inc., CA, USA; and Xerogel, available from Allied Signal, NJ, USA.

Above the first insulator layer 120 is a first hardmask layer 125 comprising one of nitrides, oxides, as well as metals such as TaN, Ta, or W. Above the first hardmask layer 125 is a second insulator layer 130 comprising a low dielectric constant material, such as SiLK®, FLARE®, and traditional materials such as silicon dioxide and fluorinated silicon dioxide (FSG), and microporous glasses such as Nanoglass®, as well as Black Diamond, Coral, and Xerogel. Then, above the second insulator layer 130 is a second hardmask layer 135, which also comprises one of nitrides, oxides, as well as metals such as TaN, Ta, or W.

The first insulator layer 120 and first hardmask layer 125 form a first metallization layer 101, while the second insulator layer 130 and the second hardmask layer 135 form a second metallization layer 102. Interspersed within the first and second metallization layers 101, 102 of the integrated circuit structure 100 are a plurality of wiring conductors 115, preferably comprising copper, but also possibly comprising tungsten or other metals such as silver, gold, etc.

Figure 2:
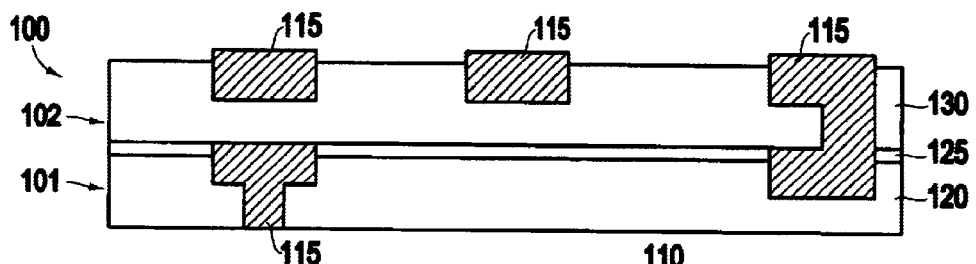
FIG. 2 is a cross-sectional schematic diagram of a first embodiment of an integrated circuit structure undergoing rework processing according to the present invention.
Figure 3:
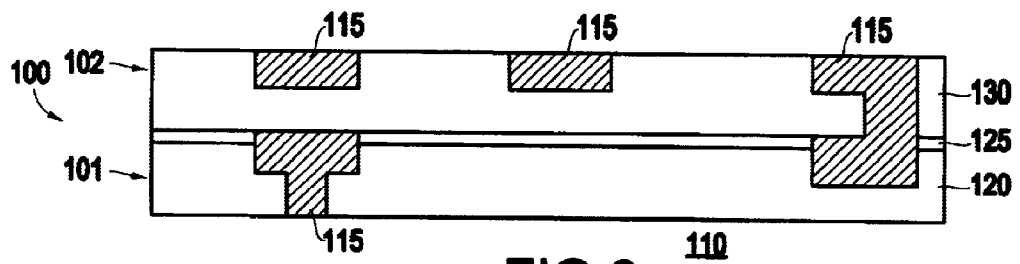
FIG. 3 is a cross-sectional schematic diagram of a first embodiment of an integrated circuit structure undergoing rework processing according to the present invention.

As shown in FIG. 2, the integrated circuit structure 100 undergoes a RIE (reactive ion etching) process wherein the second hardmask layer 135 is removed from the top of the second metallization layer 102, thereby exposing the upper surfaces of some of the wiring conductors 115. Next, a CMP (chemical-mechanical polish) process occurs, wherein a portion of second insulator layer 130 is removed as well as portions of the wiring conductors 115 in the second metallization layer 102, which is illustrated in FIG. 3.

Figure 4:
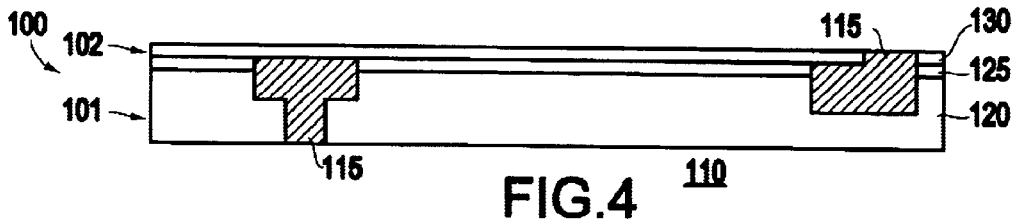
FIG. 4 is a cross-sectional schematic diagram of a first embodiment of an integrated circuit structure undergoing rework processing according to the present invention.
Figure 5:
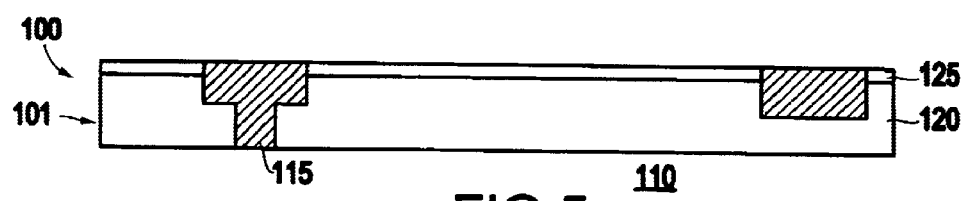
FIG. 5 is a cross-sectional schematic diagram of a first embodiment of an integrated circuit structure undergoing rework processing according to the present invention.

The next step of the reworking process involves subjecting the integrated circuit structure 100 to another CMP process, as depicted in FIG. 4, whereby a greater portion of the second insulator layer 130 is removed, as well as most of the wiring conductors 115 in the second metallization layer 102. Finally, as shown in FIG. 5, the single level rework is completed wherein the entire second insulator layer 130 and wiring conductors 115 within the second metallization layer 102 are removed via a CMP process, thereby leaving only the first metallization layer 101 intact with its plurality of wiring conductors 115 interspersed within the first insulator layer 120 and the first hardmask layer 125. As mentioned above, the hardmask layer 125 protects the interconnect layer 101 when the overlying interconnect layer 100 is removed. More specifically, the part of the removal process that removes the last part of the soft low k dielectric 130 in FIG. 5 is selective to the softer low k dielectric 130 and does not substantially affect the harder insulator hardmask layer 125. This allows the overlying interconnect layer 100 to be completely removed, without affecting the underlying interconnect layer 101, thereby allowing the interconnect layer 100 to be reworked individually without sacrificing any of the costs, time, and expense associated with the formation of the underlying BEOL and BEOL layers (layers 101 and below). Layer 101 and similar underlying layers can be similarly removed, thereby precisely controlling the amount of layers that need to be reworked.

In this first embodiment, a nearly constant removal process is used to start at the upper surface of the integrated circuit structure 100, wherein each level (here one metallization level 102) is sequentially removed. The CMP polish uses a slurry, preferably a slurry designed to remove copper and dielectric, to remove the second insulator layer 130, second hardmask layer 135, and some of the wiring conductors 115. Alternatively, a wet or dry etchant, such as a HF (hydrofluoric) etchant may be employed to remove the layers. If an etchant is utilized, then a repetitive sequence of etchants could be used for optimal removal of the exposed films at various points during the process. For example, a perflourocarbon dry etchant is optimal for removing $Si_3N_4$, while a nitrogen based etchant is optimal for removing most organic low k materials.

Additionally, the low k materials, such as those in the second insulator layer 130 may be heat treated prior to removal in order to alter its removal rate. Alternatively, the second insulator layer 130 is first heat treated (or treated chemically, etc.) in order to degrade its adhesion or mechanical strength, and is then removed using lift-off tape, a liquid chemical, such HF, or a dry etch chemical, such as vapor HF, which further causes some or all of the wiring conductors 115 to delaminate. Then, a copper polish is used to complete the removal process.

Still alternatively, an integration of a hard dielectric (for example, $Si_3N_4$, or silicon carbide) scratch stop is used during the initial integrated circuit fabrication. This scratch stop is positioned coplanar with the BPSG/W level which resides under the repetitive sequence of low-K dielectric and copper interconnect structures and on top of the electronic devices such as transistors that reside underneath the BPSG/W level. If a multilevel rework is required, then the films are removed down to the scratch stop. Again, the films may be removed using a combination of the above-described RIE and CMP processes, which are repeated to remove each level, wherein the copper removal rate is preferably greater than the low k removal rate.

If the scratch layer is not completely effective, a strapped local interconnect or MC can be formed above the original MC, and then the process of record (POR) back end of the line (BEOL) processing is used to refabricate the multilevel BEOL. The above procedures may be practiced alone or in combination with ultrasonic or megasonic clean steps to vibrate the BEOL structures off or to degrade them for subsequent simplified removal. Thus, as shown, the first embodiment of the present invention is an effective process to rework a multilevel copper/low k integrated circuit interconnection BEOL structure 100.

The second embodiment is illustrated in FIGS. 6 through 10. This second embodiment teaches the deposition of a polish stop after partial or complete dielectric (low k) removal occurs. The polish stop functions to enable removal of the (typically copper) wiring conductors 215, to a thickness coplanar with the dielectric or underlying level (if the dielectric is completely removed).

FIGS. 6 through 10 describe the sequence relating to the method for practicing this embodiment according to the present invention. As shown in FIG. 6, the first step involves providing a substrate 210 (such as a silicon substrate) having BEOL (front-end-of-line) devices, and one or more BEOL metallization levels 201, 202 fabricated thereon. The integrated circuit device 200, as shown, specifically comprises a first insulator layer 220 comprising a low dielectric constant material (low k dielectric), such as SiLK®, FLARE®, and traditional materials as silicon dioxide, fluorinated silicon dioxide (FSG), and microporous glasses such as Nanoglass®, as well as Black Diamond, Coral, and Xerogel.

Above the first insulator layer 220 is a first hardmask layer 225 comprising one of nitrides, oxides, $Si_3N_4$, as well as metals such as TaN, Ta, or W. Above the first hardmask layer 225 is a second insulator layer 230 comprising a low dielectric constant material, such as SiLK®, FLARE®, and traditional materials such as silicon dioxide and fluorinated silicon dioxide (FSG), and microporous glasses such as Nanoglass®, as well as Black Diamond, Coral, and Xerogel. Then, above the second insulator layer 230 is a second hardmask layer 235, which also comprises one of nitrides, oxides, $Si_3N_4$, as well as metals such as TaN, Ta, or W.

The first insulator layer 220 and first hardmask layer 225 form a first BEOL metallization layer 201, while the second insulator layer 230 and the second hardmask layer 235 form a second BEOL metallization layer 202. Interspersed within the first and second BEOL metallization layers 201, 202 of the integrated circuit structure 200 are a plurality of wiring conductors 215, preferably comprised of copper.

In the next phase of the rework process, as shown in FIG. 7, the second hardmask layer 235 is removed, thereby exposing the second insulator layer 230 and the wiring conductors 215 of the second BEOL metallization layer 202. This removal process occurs by using known techniques, such as $N_2$ or $O_2/N_2$ RIE to a depth beneath the depth of the wiring conductors in the second metallization level 202.

Figure 8:
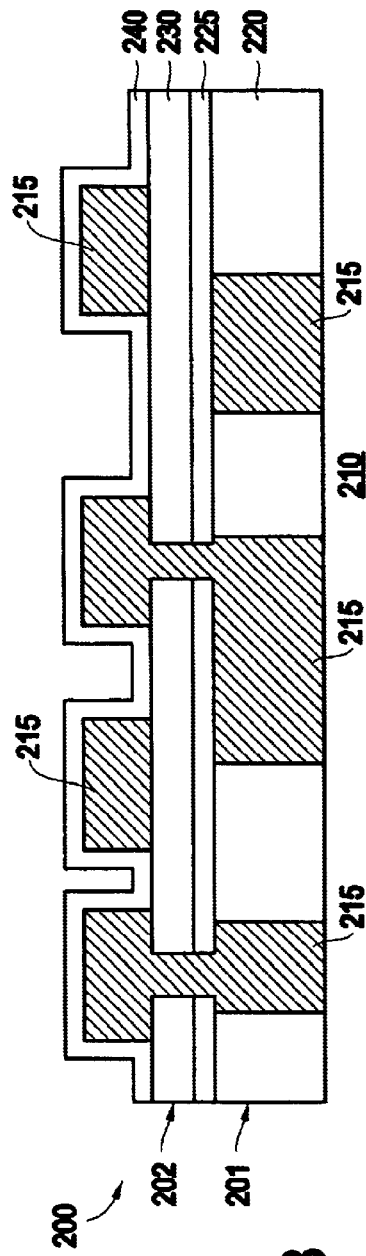
FIG. 8 is a cross-sectional schematic diagram of a second embodiment of an integrated circuit structure undergoing rework processing according to the present invention.
Figure 9:
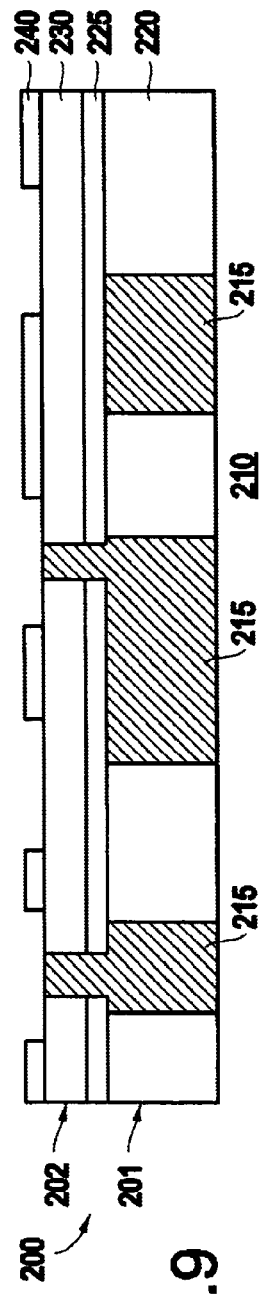
FIG. 9 is a cross-sectional schematic diagram of a second embodiment of an integrated circuit structure undergoing rework processing according to the present invention.

Next, as shown in FIG. 8, a thin film etch stop 240 is deposited over the integrated circuit device 200. This is performed preferably using a directional thin film deposition method such as physical vapor deposition or PVD comprised of TaN, Ta, W or other metal, but also possibly a dielectric deposition method comprising $SiO_2$ oxide or $Si_3N_4$ nitride or other dielectric such as silicon carbide. In FIG. 9, it is shown that the integrated circuit structure 200 is polished by removing the protruding wiring conductors 215 from the second metallization level 202, and the etch stop layer 240, resulting in exposing the second insulator layer 230, etch stop layer 240 over the dielectric regions 230 (i.e., second insulator layer 230), and exposed wiring conductors 215.

Figure 10:
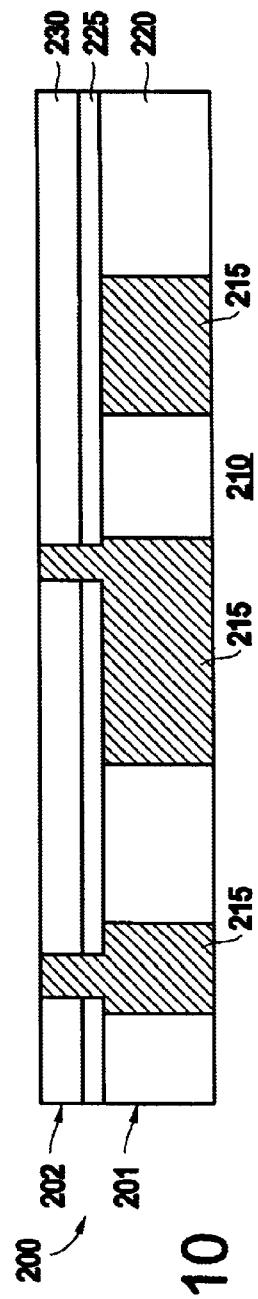
FIG. 10 is a cross-sectional schematic diagram of a second embodiment of an integrated circuit structure undergoing rework processing according to the present invention.
Figure 15B:
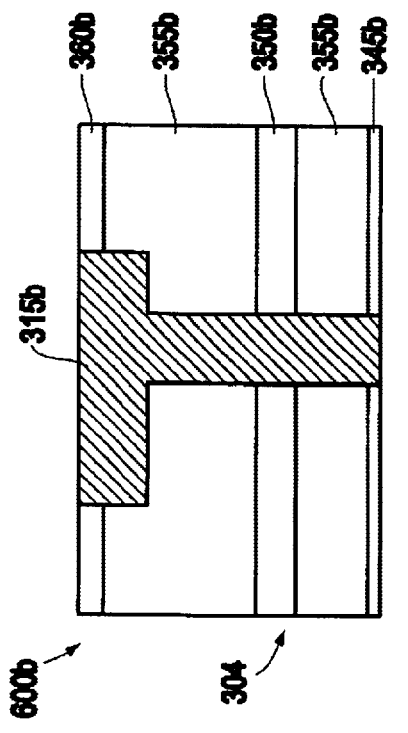
FIG. 15(b) is a cross-sectional schematic diagram of a third embodiment of an integrated circuit structure undergoing rework processing according to the present invention.
Figure 15D:
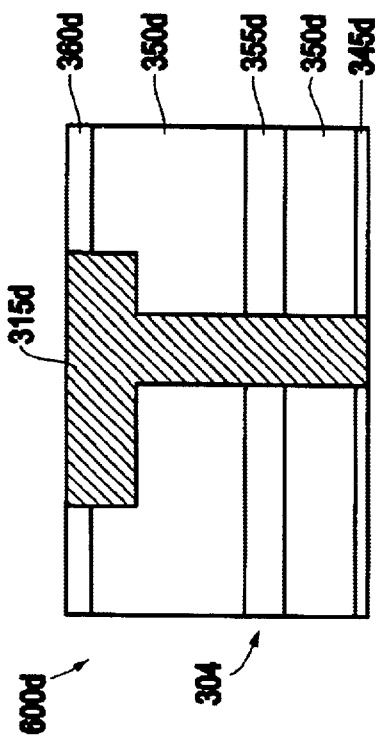
FIG. 15(d) is a cross-sectional schematic diagram of a third embodiment of an integrated circuit structure undergoing rework processing according to the present invention.
Figure 15A:
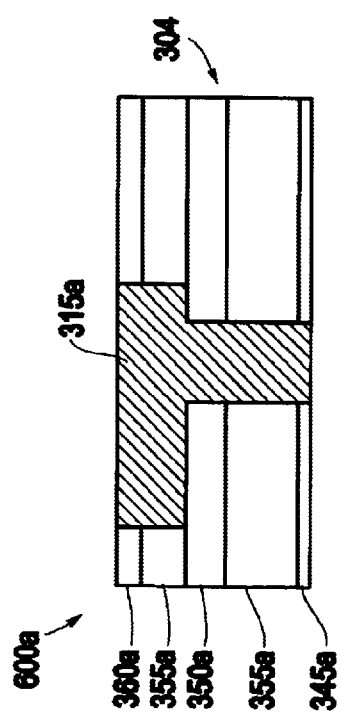
FIG. 15(a) is a cross-sectional schematic diagram of a third embodiment of an integrated circuit structure undergoing rework processing according to the present invention.
Figure 15C:
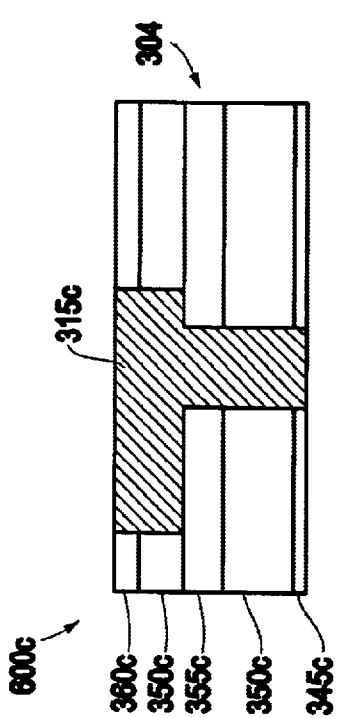
FIG. 15(c) is a cross-sectional schematic diagram of a third embodiment of an integrated circuit structure undergoing rework processing according to the present invention.

Finally, as shown in FIG. 10, the integrated circuit device 200 is further polished, thereby removing the remaining exposed etch stop thin film 240, and creating a clean and planarized upper surface which includes the second insulator layer 230 and exposed portions of the wiring conductors 215 in the second BEOL metallization layer 202. Upon completion of this rework process, the BEOL level(s) may be rebuilt using the POR. This etch stop 240 allows the metal to be etched without damaging the soft low k insulator 230.

Possibly, in the current BEOL level rebuild process, a rework artifact (not shown) will remain as an extended via. However, the complete structure may be reworked such that no artifact is remaining, or if the line portion only of a dual damascene structure is removed, then a single damascene process sequence may be used to refabricate only the line, leaving no artifact, method taught by the second embodiment could be used for removal of a single or partial BEOL level or the steps could be repeated several times to remove an entire BEOL.

In a third embodiment illustrated in FIGS. 11 through 19(b), a rework process is shown which requires the incorporation of a cap dielectric hardmask material 325, 335, 345 (e.g. $SiO_2$, $Si_3N_4$, inorganic materials, silsesquioxanes, etc.) and an underlying low dielectric material 320, 330, 340 (e.g. SiLK®, FLARE®, and traditional materials such as silicon dioxide and fluorinated silicon dioxide (FSG), and microporous glasses such as Nanoglass®, as well as Black Diamond, Coral, and Xerogel, organic materials, and other low k dielectrics, etc.), wherein the cap and underlying dielectric materials have different removal properties, within a copper BEOL structure 300 at some or all levels.

The cap dielectric 325, 335, 345 functions as a thin film removal end point stop which is currently unavailable in Cu/low k BEOL schemes due to the "lower modulus" of low k thin films. FIGS. 11 and 12 show the basic structure of the device 300 provided by the third embodiment, according to the present invention. The basic structure of the integrated circuit device 300 is similar to the devices 100, 200 of the first and second embodiment, and are repeated here for clarity.

As shown in FIG. 11, the first step involves providing a substrate 310 (such as a silicon substrate) having BEOL (front-end-of-line) devices, and one or more BEOL metallization levels 301, 302, 303, 304 fabricated thereon. The integrated circuit device 300, as shown, specifically comprises a first insulator layer 320 comprising a low dielectric constant material (low k dielectric), such as SiLK®, FLARE®, and traditional materials such as silicon dioxide, silicon dioxide (FSG), and microporous glasses such as Nanoglass®, as well as Black Diamond, Coral, and Xerogel.

Above the first insulator layer 320 is a first hardmask layer 325 comprising one of nitrides, oxides, $Si_3N_4$, as well as metals such as TaN, Ta, or W. Above the first hardmask layer 325 is a second insulator layer 330 comprising a low K dielectric constant material, such as those described above. Then, above the second insulator layer 330 is a second hardmask layer 335, which also comprises one of nitrides, oxides, $Si_3N_4$, as well as metals such as TaN, Ta, or W. Next, above the second hardmask layer 335 is a third insulator layer 340 comprising a low dielectric constant material, such as those described above. Then, above the third insulator layer 340 is a third hardmask layer 345, which also comprises one of the above-described materials found in the first and second hardmask layers 325, 335.

The first insulator layer 320 and first hardmask layer 325 form a first BEOL metallization layer 301, while the second insulator layer 330 and the second hardmask layer 335 form a second BEOL metallization layer 302. Similarly, the third insulator layer 340 and third hardmask layer 345 form a third BEOL metallization layer 303. Interspersed within the first, second, and third BEOL metallization layers 301, 302, 303 of the integrated circuit structure 300 are a plurality of wiring conductors 315, preferably comprised of copper.

Referring to FIG. 12, a dual damascene method for fabricating a Cu/cap dielectric/underlying dielectric BEOL required for subsequent single or multiple level removal is as follows. First, a substrate 310 having BEOL devices and one or more BEOL levels 301, 302, 303 are provided thereon. Next, a thin film removal end point stop (first underlying dielectric thin film) 350 is deposited on the device 300. The thin film 350 is thicker than POR $Si_3N_4$. The thickness of thin film 350 may be controlled to any desired thickness or depth. Next, a second underlying dielectric thin film 355, such as SiLK®, FLARE®, and traditional materials such as silicon dioxide, fluorinated silicon dioxide (FSG), and microporous glasses such as Nanoglass®, as well as Black Diamond, Coral, and Xerogel is deposited above the first underlying dielectric thin film 350. Then, a cap hardmask material 360 is deposited over the second underlying dielectric thin film 355. The hardmask material 360 preferably comprises one of nitrides, oxides, $Si_3N_4$, as well as metals such as TaN, Ta, or W.

The next step of the process involves using typical copper interconnect photolithography/etch, liner/seed, and electroplate methods to form the dual damascene via and line wiring patterns in the hardmask 360 and first and second dielectric thin film layers 350, 355, which then forms a fourth metallization level 304. Upon completion of these steps, a typical copper interconnect dual damascene pattern results creating structure 315. Finally, the device 300 is polished using typical copper CMP, thereby resulting in a fully planarized integrated circuit device 300.

FIGS. 13 through 19 illustrate variations in structure of the third embodiment, wherein the steps described in FIGS. 11 and 12 may be reversed and/or repeated. Specifically, FIGS. 13 through 17 illustrate several dual damascene approaches, wherein all figures denoted as (a) and (c) represent the pre-rework structures, and all figures denoted as (b) and (d) represent the post-rework structures, with the difference between the pre-rework and post-rework structures being a difference in the geometric structure, for example, in the depth of the metallization levels, including differences in the thickness of either the first and/or second dielectric layers 350(b), 350(d), 355(b), 355(d).

FIGS. 13(a), 13(b), 14(a), and 14(b) illustrate a dual damascene integrated circuit structure 400a, 400b, 500a, 500b which are each isolated representations of the fourth metallization level 304 of the device 300 shown in FIG. 12. The device 400a, 400b, 500a, 500b comprises the third hardmask layer 345a, 345b comprising one of nitrides, oxides, $Si_3N_4$, as well as metals such as TaN, Ta, or W. Above the third hardmask layer 345a, 345b is the thin film removal end point stop (first underlying dielectric thin film) 350a, 350b. The thickness of thin film 350a, 350b may be controlled to any desired thickness or depth. Next, the second underlying dielectric thin film 355a, 355b, such as SiLK®, FLARE®, and traditional materials such as silicon dioxide, fluorinated silicon dioxide (FSG), and microporous glasses such as Nanoglass®, as well as Black Diamond, Coral, and Xerogel is deposited above the first underlying dielectric thin film 350a, 350b. Then, a cap hardmask material 360a, 360b is deposited over the second underlying dielectric thin film 355a, 355b. The hardmask material 360a, 360b preferably comprises one of nitrides, oxides, $Si_3N_4$, as well as metals such as TaN, Ta, or W. The differences between the devices 400a,b and 500a,b of FIGS. 13 and 14, respectively, are in the relative thicknesses of the second underlying dielectric thin film 355a, 355b.

Other variations of the general design are further illustrated (devices 600*a,b,c,d*, 700*a,b*, 800*a,b*, 900*a,b*, 1000*a,b*), wherein the second dielectric thin film 355*a*, 355*b* sandwiches the first dielectric thin film 350*a*, 350*b*, as shown in FIGS. 15(*a*) and 15(*b*), or the first dielectric thin film 350*c*, 350*d* sandwiches the second dielectric thin film 355*c*, 355*d* allowing removal of the level to be partial or complete, as shown in FIGS. 15(*c*) and 15(*d*), or the second dielectric thin film 355*a*, 355*b* is below the first dielectric thin film 350*a*, 350*b*, as shown in FIGS. 16(*a*) and 16(*b*) and 17(*a*) and 17(*b*). Moreover, FIGS. 17(*a*) and 17(*b*) also show the third hardmask layer 345*a*, 345*b* sandwiching the second dielectric thin film 355*a*, 355*b*. Similarly, a single damascene method may be used to fabricate a Cu/first dielectric/second dielectric BEOL conducive to single or multiple level removal resulting in similar structures as illustrated in FIGS. 18 and 19.

Furthermore, in FIGS. 18(*a*), 18(*b*), and 19(*b*) it is shown that the third hardmask layer 345*a*, 345*b* sandwiches the first dielectric thin film 350*a*, 350*b*. Additionally, FIG. 19(*a*) illustrates a duplicative third hardmask layer 346*a* above the third hardmask layer 345*a*. Again, these variations illustrate the numerous methods to integrate a first dielectric/second dielectric insulator structure within a Copper wiring level, and all of the variations of the structures and methods have been shown to demonstrate the scope and spirit of the present invention.

The sequential rework process begins by providing any Copper/first dielectric/second dielectric BEOL structure, as described above (as shown in the figures denoted by (a) and (c)). Then, any remaining surface level hardmask material 360, (e.g. $Si_3N_4$, $SiO_2$, etc) are removed using known RIE, wet etch, or CMP techniques. Next, the now exposed first or second dielectric material 350, 355 is removed using known RIE, wet etch, or CMP techniques, to the desired depth, wherein the process may be optimized by removing a single dielectric thin film or multilevel dielectric thin film stopping on a dielectric thin film. Then, the copper wiring conductors 315 are removed such that it is planar with the dielectric thin film, 350, 355. Once the level(s) have been removed the standard POR is then followed to reconstruct the levels (as shown in the figures denoted by (b) and (d)).

In a fourth embodiment, a solution of how to integrate an extended via layer in a dual damascene low k BEOL level is shown. According to this embodiment, an extended via structure 1100 is disclosed which can be integrated within one or more BEOL levels. This extended via structure is formed using a single damascene process sequence with processing optimized such that the via is formed smaller than the dual damascene via with which it is connected. The fourth embodiment introduces two variations of another possible rework process in addition to those previously described above, wherein this fourth embodiment may be used in conjunction with the first, second, third, or fifth (described below) embodiments.

Figure 20:
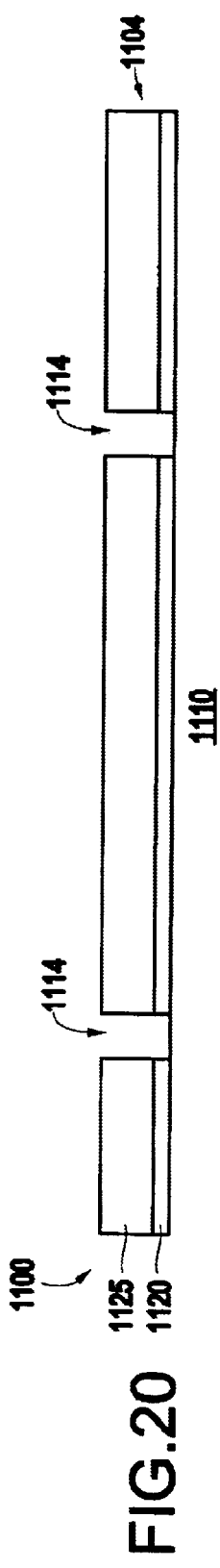
FIG. 20 is a cross-sectional schematic diagram of a fourth embodiment of an integrated circuit structure undergoing rework processing according to the present invention.
Figure 21:
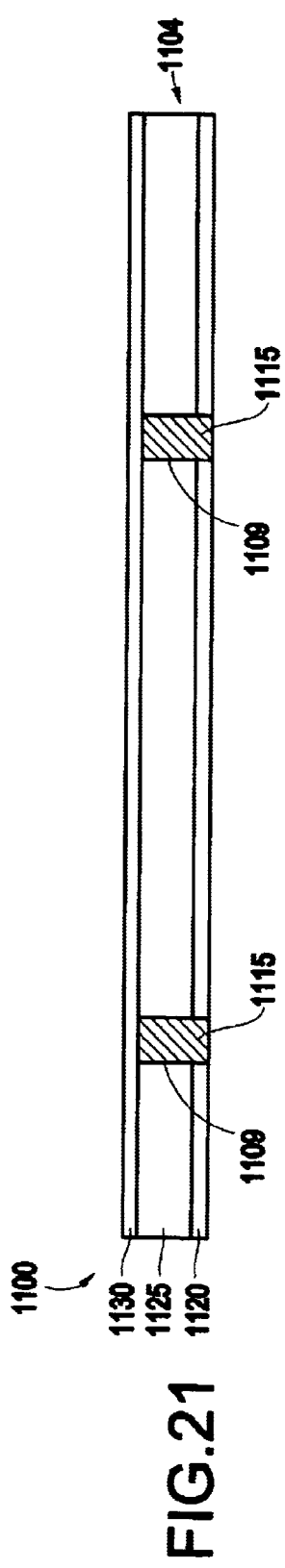
FIG. 21 is a cross-sectional schematic diagram of a fourth embodiment of an integrated circuit structure undergoing rework processing according to the present invention.
Figure 22:
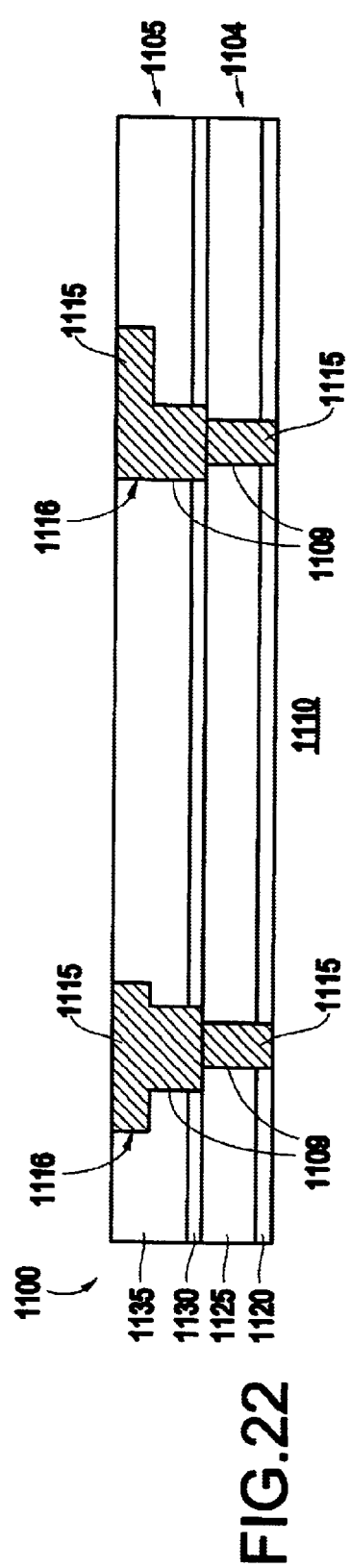
FIG. 22 is a cross-sectional schematic diagram of a fourth embodiment of an integrated circuit structure undergoing rework processing according to the present invention.

FIGS. 20 through 22 illustrate a first process sequence for forming such an integrated extended via structure 1100 comprising first providing a silicon substrate 1110 having BEOL devices and possibly one or more BEOL levels 1104, 1105 thereon. Here, a first (cap) thin film layer 1120, such as $Si_3N_4$, is deposited over the substrate 1110. Then, a second (low K dielectric) thin film layer 1125, such as such as SiLK®, FLARE®, and traditional materials such as silicon dioxide, fluorinated silicon dioxide (FSG), and microporous glasses such as Nanoglass®, as well as Black Diamond, Coral, and Xerogel is deposited over the first (cap) thin film layer 1120. Upon completion of this step, a first via pattern 1114 is photolithographically defined in the first and second thin film layers 1120, 1125. Here, the first via definition process is optimized to form the first via 1114 smaller than the subsequently formed second via 1116 (lower portion of structure 1117 shown in FIG. 22).

Next, the exposed first and second thin film layers 1120, 1125 are removed using typical photolithography/RIE damascene and dual damascene processing, and a typical dual damascene liner/seed thin film 1109 is deposited in the first via 1114. After this, a conductor (wiring conductor) 1115, preferably comprising a conductive material such as copper or tungsten, is deposited in the first via 1114 and over the liner thin film 1109. Next, a polishing process occurs, thereby forming a fully planarized device 1100. Thereupon, a third (cap) thin film layer 1130, such as $Si_3N_4$, is deposited over the planarized device 1100, which is shown in FIG. 21.

Next, a fourth (or alternatively, a fourth and fifth) (low dielectric) thin film layer 1135, such as SiLK®, FLARE®, and traditional materials such as silicon dioxide, fluorinated silicon dioxide (FSG), and microporous glasses such as Nanoglass®, as well as Black Diamond, Coral, and Xerogel, is deposited over the third (cap) thin film layer 1130. The next step of the process involves photolithographically defining a dual damascene second via/line pattern 1116 in the fourth (or fourth and fifth) (low dielectric) thin film layer 1135. Next, the exposed fourth (or fourth and fifth) (low dielectric) thin film layer 1135 and third (cap) thin film layer 1130 are removed, and a typical dual damascene liner/seed thin film 1109 is deposited in the second via 1116. After this, a conductor (wiring conductor) 1115, preferably comprising a conductive material such as copper or tungsten, is deposited in the second via 1116 and over the liner/seed thin film 1109. Next, a polishing process occurs, thereby forming a fully planarized device 1100 as shown in FIG. 22. In the fourth embodiment, the second via 1116 may be formed using the same photomask as is used for the first via 1114. However, photo exposure conditions may be optimized such that the resultant two vias 1114, 1116 are sized differently. For example, the first via 1114 is approximately 30% smaller than the second via 1116 to address pitch related process window issues.

Figure 23:
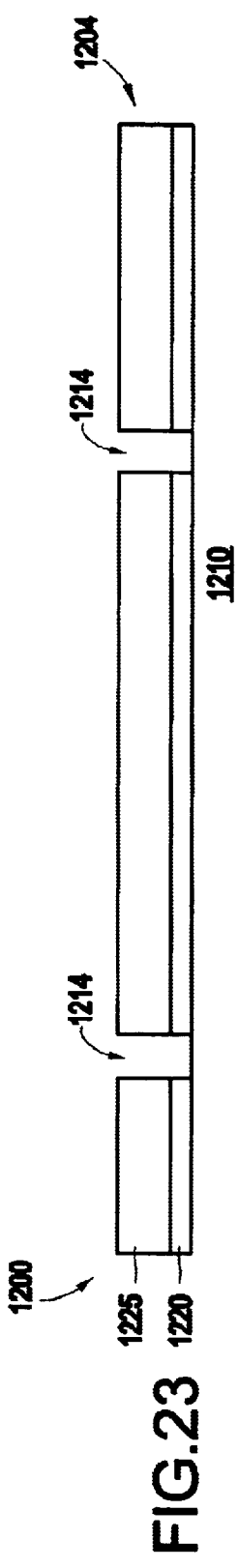
FIG. 23 is a cross-sectional schematic diagram of a fourth embodiment of an integrated circuit structure undergoing rework processing according to the present invention.
Figure 24:
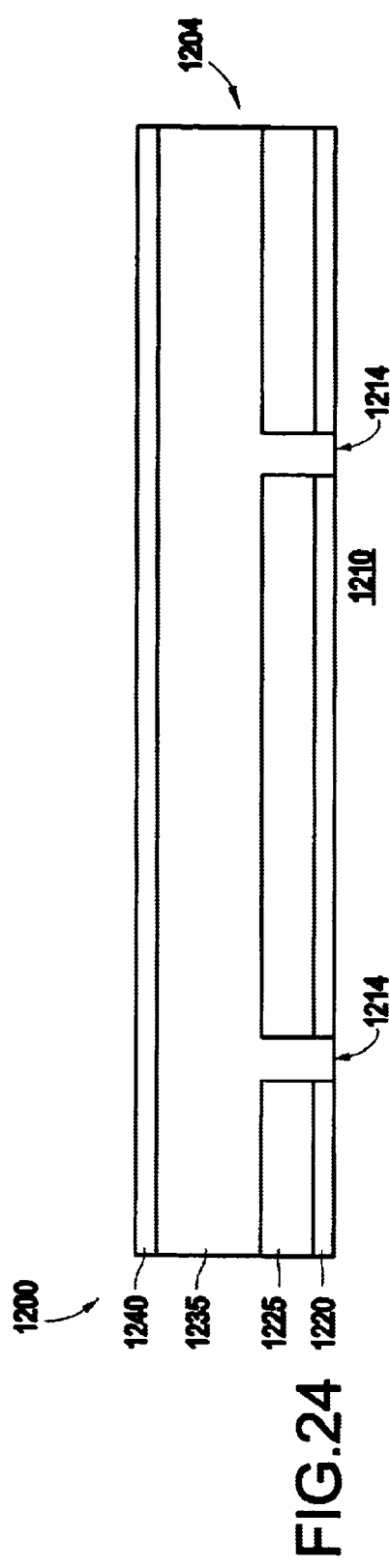
FIG. 24 is a cross-sectional schematic diagram of a fourth embodiment of an integrated circuit structure undergoing rework processing according to the present invention.
Figure 25:
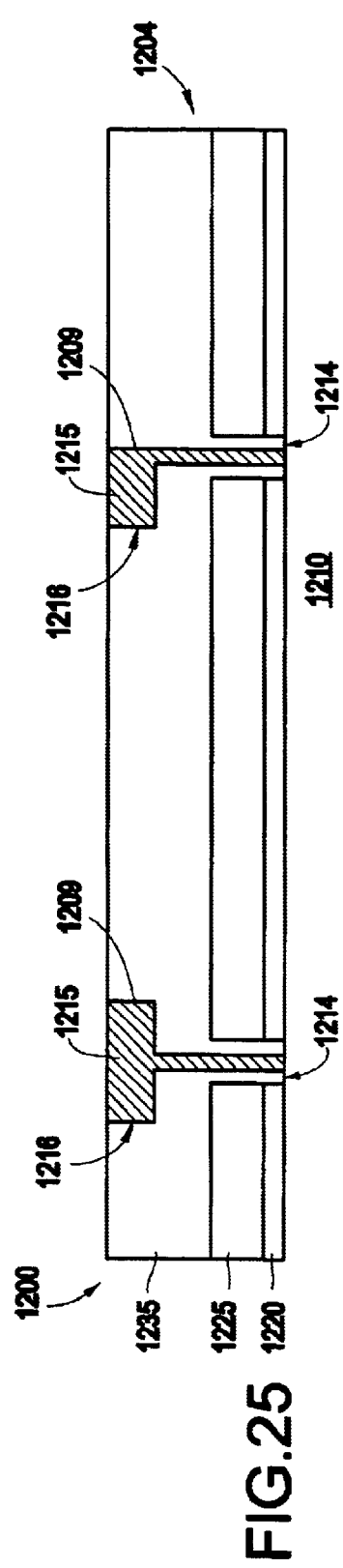
FIG. 25 is a cross-sectional schematic diagram of a fourth embodiment of an integrated circuit structure undergoing rework processing according to the present invention.

In a second process according to the fourth embodiment of the present invention, illustrated in FIGS. 23 through 25, a sequence for forming an integrated extended via structure 1200 is shown comprising first providing a silicon substrate 1210 having BEOL devices and possibly one or more BEOL levels 1204 thereon. Here, a first (cap) thin film layer 1220, such as $Si_3N_4$, is deposited over the substrate 1210, as is seen in FIG. 23. Then, a second (low dielectric) thin film layer 1225, such as SiLK®, FLARE®, and traditional materials such as silicon dioxide, fluorinated silicon dioxide (FSG), and microporous glasses such as Nanoglass®, as well as Black Diamond, Coral, and Xerogel, at a thickness of approximately 200 nm, for example, is deposited over the first (cap) thin film layer 1220. Upon completion of this step, a first via pattern 1214 is photolithographically defined in the first and second thin film layers 1220, 1225. Here, the first via definition process is optimized to form the first via 1214 larger than the subsequently formed second via 1216.

Next, the exposed first and second thin film layers 1220, 1225 are removed. Then, a third (low dielectric) thin film material 1235, such as SiLK®, FLARE®, and traditional materials such as silicon dioxide, fluorinated silicon dioxide (FSG), and microporous glasses such as Nanoglass®, as well as Black Diamond, Coral, and Xerogel, is deposited over the second thin film layer 1225, as is best illustrated in FIG. 24. Next, a thin hardmask material 1240 is deposited over the third (low dielectric) thin film material 1235. The next step in the process involves photolithographically defining a dual damascene second via/line pattern 1216 in the third (low dielectric) thin film material 1235 and hardmask layer 1240. After this, the hardmask layer 1240 and exposed third (low dielectric) thin film material 1235 is removed. Thereupon, a typical dual damascene liner/seed thin film 1209 is deposited in the first and second vias 1214, 1216. Upon completion of this step, a conductor (wiring conductor) 1215, preferably comprising a conductive material such as copper or tungsten, is deposited in the second via/line pattern 1216 and over the liner thin film 1209. Next, a polishing process occurs, thereby forming a fully planarized device 1200, as shown in FIG. 25. The process sequence results in an extended via 1216 formed in the same low k material 1235 as the dual damascene line/via 1214 wherein the extended via 1216 is also surrounded by a first dielectric 1225 which is buried within the low k material 1235.

A sixth embodiment of the present invention is illustrated in FIGS. 26 through 29. This embodiment involves a rework process and solves the problem of how to remove and reconstruct a partial integrated circuit BEOL interconnect level. The redundant stud interconnection structure 1300 of the present invention comprises a via 1316 integrated and formed in pieces during three photolithographic process sequences and two or more deposition sequences. The process comprises providing a silicon substrate 1310 having BEOL devices and one or more BEOL level 1301, 1302a, 1303 thereon.

Here, the structure of the device 1300, as shown in FIG. 26, comprises a first cap thin film layer 1320, such as $Si_3N_4$, is deposited over the substrate 1310. Then, a first low dielectric thin film layer 1325, such as SiLK® or $SiO_2$, is deposited over the first cap thin film layer 1320. Next, a second cap thin film layer 1330, such as Si3N4, is deposited over the first low dielectric thin film layer 1325. Thereupon, a second low dielectric thin film layer 1335, such as SiLK®, FLARE®, and traditional materials such as silicon dioxide, fluorinated silicon dioxide (FSG), and microporous glasses such as Nanoglass®, as well as Black Diamond, Coral, and Xerogel, is deposited over the second cap thin film layer 1330, followed by a third cap thin film layer 1340, such as $Si_3N_4$, and a third low dielectric thin film layer 1345, such as SiLK®, FLARE®, and traditional materials such as silicon dioxide, fluorinated silicon dioxide (FSG), and microporous glasses such as Nanoglass®, as well as Black Diamond, Coral, and Xerogel, sequentially deposited thereon.

The first cap and dielectric thin film layers 1320, 1325 form a first metallization layer 1301 after typical photolithography/etch and subsequent liner/seed, electroplate and CMP steps as described previously. Similarly, the second cap and dielectric thin film layers 1330, 1335 form a second metallization layer 1302a after typical photolithography/etch and subsequent liner/seed, electroplate and CMP steps also as described previously. Likewise, the third cap and dielectric thin film layers 1340, 1345 form a third metallization layer 1303 after typical photolithography/etch and subsequent liner/seed, electroplate and CMP steps also as described previously. Interspersed within the first, second, and third metallization layers 1301, 1302a, 1303 of the integrated circuit structure 1300 are a plurality of wiring conductors 1315, preferably comprising copper.

Figure 28:
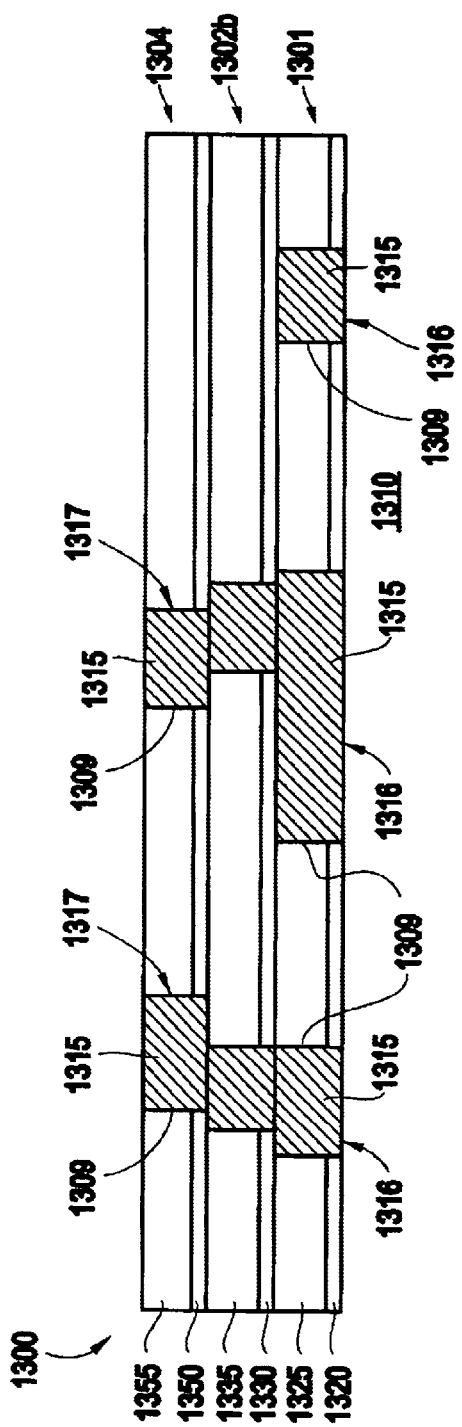
FIG. 28 is a cross-sectional schematic diagram of a fifth embodiment of an integrated circuit structure undergoing rework processing according to the present invention.

The next step of the process involves removing one or more BEOL levels 1303 using known techniques. Thus, regions of a first via 1316 and liner material 1309 and regions of the second low dielectric thin film layer 1335 are now exposed, as shown in FIG. 27, thereby resulting in an altered second metallization level 1302b. Next, as illustrated in FIG. 28, a fourth cap thin film layer 1350, such as $Si_3N_4$ is deposited on the third low dielectric thin film 1335. Then, a fourth low dielectric thin film layer 1355, such as SiLK®, FLARE®, and traditional materials such as silicon dioxide, fluorinated silicon dioxide (FSG), and microporous glasses such as Nanoglass®, as well as Black Diamond, Coral, and Xerogel, is deposited over the fourth cap thin film layer 1350.

The next step of the process involves photolithographically forming a second via 1317 over the first via 1316, wherein the second via 1317 is preferably larger than the first via 1316, although the second via 1317 may be smaller than the first via 1316. Next, a typical damascene liner/seed thin film 1309 is deposited in the second via 1317. Then, a conductor (wiring conductor such as copper) 1315 is deposited in the second via 1317 and over the liner thin film 1309 using typical copper damascene techniques. After this, a CMP polishing process occurs, thereby yielding a planarized device 1300. The fourth thin film layer 1355, fourth cap thin film layer 1350, and the conductors 1315 within the second via 1317 together form a new third metallization level 1304.

Figure 29:
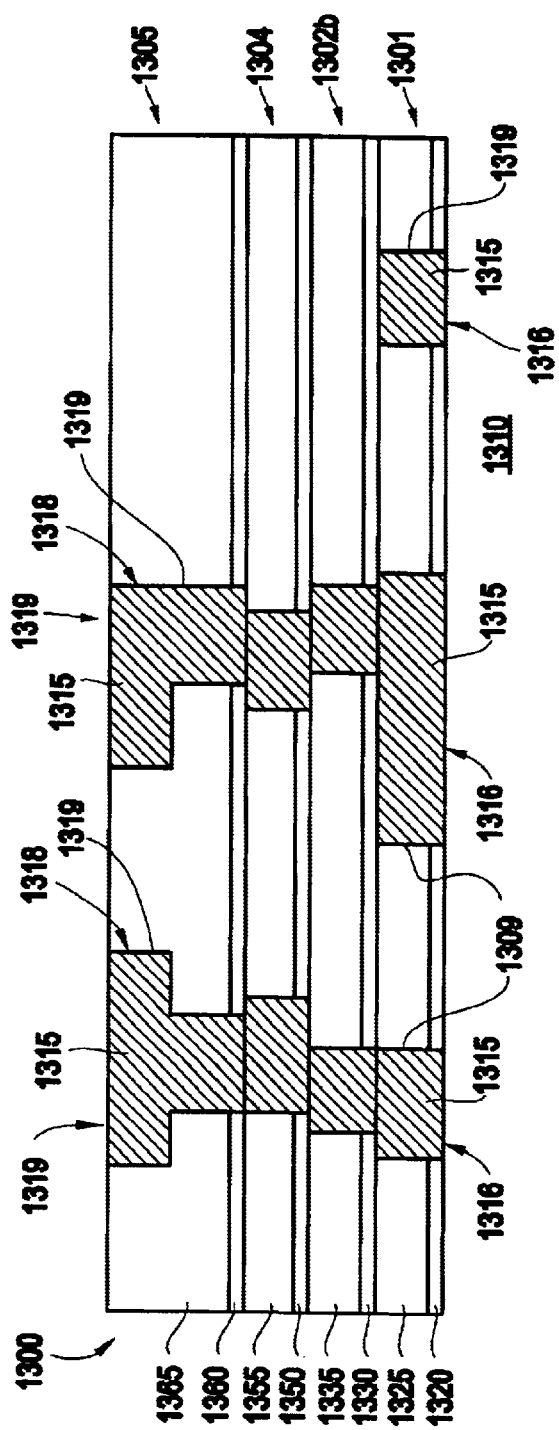
FIG. 29 is a cross-sectional schematic diagram of a fifth embodiment of an integrated circuit structure undergoing rework processing according to the present invention.

Next, as illustrated in FIG. 29, a fifth cap thin film layer 1360, such as $Si_3N_4$, is deposited on the fourth low dielectric thin film layer 1355. Then, a fifth low dielectric thin film layer 1365, such as SiLK® or $SiO_2$, is deposited over the fifth cap thin film layer 1360. The next step of the process involves photolithographically defining a dual damascene line/via pattern 1318 into the fifth low dielectric thin film layer 1365. Next, a typical damascene liner/seed thin film 1309 is deposited in the third via 1318. Then, a conductor thin film 1315 is deposited in the third via 1318 and over the liner thin film 1309 using typical copper damascene techniques. After this, a polishing process occurs, thereby yielding a planarized device 1300. Thereupon, there is a continued fabrication of BEOL levels using POR. Moreover, the resultant interconnection structure 1300 shown in FIG. 29 has one connective via 1319 formed in three photolithographic steps in order to facilitate a partial level rework and accommodate photo overlay constraints.

Figure 30:
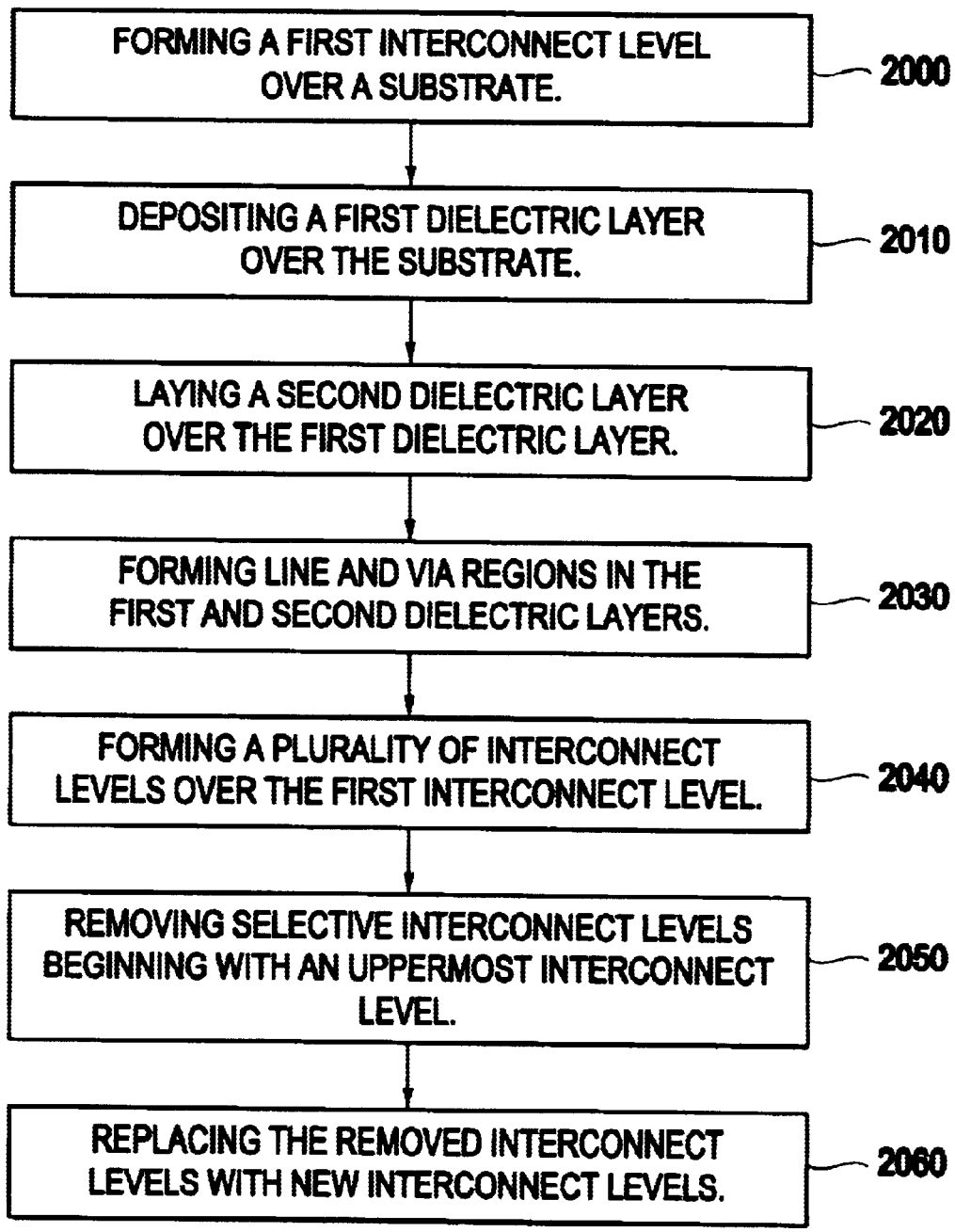
FIG. 30 is a flow diagram illustrating a preferred method of the invention.

FIG. 30 illustrates a flow diagram of a rework process according to the present invention. The method of reworking BEOL (back end of a processing line) interconnect levels of damascene metallurgy comprises first forming 2000 a first interconnect level over a substrate, which further comprises depositing 2010 a first dielectric layer over the substrate, laying 2020 a second dielectric layer over the first dielectric layer, and forming 2030 line and via regions in the first and second dielectric layers, wherein the first dielectric layer comprises a lower dielectric constant material than the first dielectric layer. Then, a plurality of interconnect levels are formed 2040 over the first interconnect level. Next, selective interconnect levels are removed 2050 beginning with an uppermost interconnect level. Finally, the removed interconnect levels are replaced 2060 with new interconnect levels.

The benefits of each embodiment is to provide a differing means of reworking either single interconnect levels or entire BEOL interconnect so as to recover some of the processing (and hence cost) already inherent in the wafer. For example the cost or more specifically the value of a wafer processed though the BEOL is significant, that of a similar wafer now processed through some of the repetitive BEOL metallic interconnect steps is even more so. Therefore, if some defect or misprocessing or other effect were to now happen to the wafer, it could be recovered using one or more of these methods rather than scrapping the wafer. The secondary item recovered with the reworks noted is time; the time to process a wafer through the BEOL is significant and through the BEOL even more so. Therefore, by using a rework process as denoted by one or more of the embodiments, one can also recover the time required to process the wafer. This is critical as at best it takes 20 days to fabricate a wafer and having to start over if a defect or misprocessing step took place in one or more of the BEOL levels would be significant. Reworking circumvents much of this lost time.

Presently there is little experience in the industry with any rework process for $SiO_2$-copper damascene BEOL semiconductor wafer fabrication. With the progression of technology to require ever higher performing semiconductor devices the dielectrics used have changed from $SiO_2$ to low K materials as previously listed. With these materials rework experience is virtually non-existent there are no teaching of how to rework any damascene interconnect structures.

The invention provides a structure that includes a protective hard insulator layer above an underlying softer low dielectric constant (low k) layer within each interconnect layer. This structure allows each interconnect layer in the BEOL processed layers to be removed individually. More specifically, in the first phase of the removal process, the overlying harder dielectric is removed first (along with a portion of the softer underlying low k dielectric). Then, the remainder of the low k dielectric and the metal wiring lines are removed in the second phase of the removal process. This second phase of the removal process does not affect the adjacent hard insulator of the next underlying interconnect layer that is just below the interconnect layer being removed. Thus, the invention is very selective and allows a single interconnect layer to be removed (even a low k dielectric layer) without affecting the next underlying layer (that it protected by its upper hard protective insulator layer). This substantially simplifies rework of the BEOL layers (by allowing single layers to be reworked).

While the invention has been described in terms of preferred embodiments, those skilled in the art will recognize that the invention can be practiced with modification within the spirit and scope of the appended claims.

What is claimed is:

1. An integrated circuit structure comprising:
   a section comprising logical and functional devices; and
   at least two layers of interconnections above said section, wherein each layer of interconnections comprises:
   a first insulator layer;
   a second insulator layer above said first insulator layer; and
   an electrical wiring within said first insulator layer and said second insulator layer,
   wherein said first insulator layer has a lower dielectric constant than that of said second insulator layer, and
   wherein an upper interconnection layer above a lower interconnection layer of said at least two layers of interconnections comprises a reworked interconnection layer having larger vias when compared to corresponding vias in said lower interconnection layer.

2. The structure in claim 1, wherein said second insulator layer is harder than said first insulator layer.

3. The structure in claim 1, wherein said second layer comprises a protection layer that protects said first layer during rework operations performed on overlying layers of interconnections.

4. The structure in claim 1, wherein said first insulator layer comprises one of carbon-doped SiO2, porous SiO2, silicon carbide based dielectrics, and polymeric dielectrics.

5. The structure in claim 1, wherein said second insulator layer comprises one of nitrides, oxides, and Si3N4.

6. The structure in claim 1, wherein said electrical wiring comprises damascene copper.

7. The structure in claim 1, wherein said first insulator layer, said second insulator layer, and said electrical wiring comprise a single interconnection layer within said structure.

8. An integrated circuit structure comprising:
   a section comprising logical and functional devices; and
   a plurality of interconnection layers above said section, wherein each of said interconnection layers comprises:
   a first insulator layer;
   a second insulator layer above said first insulator layer; and
   an electrical wiring within said first insulator layer and said second insulator layer,
   wherein said first insulator layer has a lower dielectric constant than that of said second insulator layer,
   wherein an upper interconnection layer above a lower interconnection layer of said interconnection layers comprises a reworked interconnection layer having larger vias when compared to corresponding vias in said lower interconnection layer, and
   wherein size differences between said corresponding vias in said reworked interconnection layer and vias in said lower interconnection layer compensate for pitch inconsistencies between original fabrication and rework.

9. The structure in claim 8, wherein said second insulator layer is harder than said first insulator layer.

10. The structure in claim 8, wherein said second layer comprises a protection layer that protects said first layer during rework operations performed on overlying layers of interconnections.

11. The structure in claim 8, wherein said first insulator layer comprises one of a carbon-doped SiO2, porous SiO2, silicon carbide based dielectrics, and polymeric dielectrics.

12. The structure in claim 8, wherein said second insulator layer comprises one of nitrides, oxides, and Si3N4.

13. The structure in claim 8, wherein said electrical wiring comprises damascene copper.

14. The structure in claim 8, wherein each grouping of said first insulator layer, said second insulator layer, and said electrical wiring comprise a single interconnection layer within said structure.

15. An integrated circuit structure comprising:
   a section comprising logical and functional devices; and
   a plurality of interconnection layers above said section, wherein each of said interconnection layers comprises:
   a first insulator layer;
   a second insulator layer above said first insulator layer; and
   an electrical wiring within said first insulator layer and said second insulator layer,
   wherein said first insulator layer has a lower dielectric constant than that of said second insulator layer,
   wherein an upper interconnection layer above a lower interconnection layer of said interconnection layers comprises a reworked interconnection layer having vias approximately 30% larger than corresponding vias in said lower interconnection layer, and
   wherein size differences between said corresponding vias in said reworked interconnection layer and vias in said lower interconnection layer compensate for pitch inconsistencies between original fabrication and rework.

16. The structure in claim 15, wherein said second insulator layer is harder than said first insulator layer.

17. The structure in claim 15, wherein said second layer comprises a protection layer that protects said first layer during rework operations performed on overlying layers of interconnections.

18. The structure in claim 15, wherein said first insulator layer comprises one of a carbon-doped SiO2, porous SiO2, silicon carbide based dielectrics, and polymeric dielectrics.

19. The structure in claim 15, wherein said second insulator layer comprises one of nitrides, oxides, and Si3N4.

20. The structure in claim 15, wherein said electrical wiring comprises damascene copper.

* * * * *